US006923067B2

(12) United States Patent
Coen et al.

(10) Patent No.: US 6,923,067 B2
(45) Date of Patent: Aug. 2, 2005

(54) DEFECT TYPE CLASSIFYING METHOD

(75) Inventors: Gunther Coen, Dusseldorf (DE); Ernst Lunh, Haan (DE); Dietmar Oberhoff, Leichlingen (DE)

(73) Assignee: Betriebsforschungsinstitut VDEH Institut fur Angewandte Forschung GmbH, Dusseldorf (DE)

( * ) Notice: Subject to any disclaimer, the term of this patent is extended or adjusted under 35 U.S.C. 154(b) by 0 days.

(21) Appl. No.: 10/133,244

(22) Filed: Apr. 26, 2002

(65) Prior Publication Data

US 2002/0166384 A1 Nov. 14, 2002

Related U.S. Application Data

(63) Continuation of application No. 09/273,422, filed on Mar. 22, 1999, now abandoned.

(51) Int. Cl.⁷ .............................................. G01B 17/02
(52) U.S. Cl. ............................. 73/627; 73/600; 73/602; 73/628
(58) Field of Search ........................ 73/627, 599, 600, 73/602, 620, 622, 625, 628, 598

(56) References Cited

U.S. PATENT DOCUMENTS

| 3,996,791 | A |   | 12/1976 | Niklas et al. ................. 73/602 |
| 4,092,868 | A |   | 6/1978 | Thompson et al. |
| 4,100,809 | A |   | 7/1978 | Bobrov et al. |
| 4,248,092 | A |   | 2/1981 | Vasile et al. .................. 73/643 |
| 4,313,070 | A | * | 1/1982 | Fisher .................... 310/313 R |
| 4,366,711 | A |   | 1/1983 | Weilbacher et al. .......... 73/590 |
| 4,372,163 | A |   | 2/1983 | Tittmann et al. ............. 73/602 |
| 4,570,487 | A |   | 2/1986 | Gruber ........................ 73/624 |
| 4,658,649 | A | * | 4/1987 | Brook ......................... 73/624 |
| 4,674,334 | A |   | 6/1987 | Chimenti et al. ............. 73/627 |
| H924 | H |   | 6/1991 | Chimenti .................... 73/644 |
| 5,035,144 | A |   | 7/1991 | Aussel ......................... 73/602 |
| 5,078,013 | A |   | 1/1992 | Kuramochi et al. |
| 5,212,988 | A |   | 5/1993 | White et al. .................. 73/643 |
| 5,251,486 | A |   | 10/1993 | Thompson et al. |
| 5,460,131 | A |   | 10/1995 | Kroning et al. ............. 123/321 |
| 5,469,743 | A | * | 11/1995 | Zorn ........................... 73/627 |
| 5,604,301 | A |   | 2/1997 | Mountford et al. ........ 73/54.31 |
| 5,734,588 | A |   | 3/1998 | Rose et al. ................... 73/644 |
| 5,866,820 | A | * | 2/1999 | Camplin et al. .............. 73/643 |
| 5,932,806 | A | * | 8/1999 | Rose et al. ................... 73/599 |
| 6,062,083 | A | * | 5/2000 | Dunegan ..................... 73/587 |
| 6,105,431 | A |   | 8/2000 | Duffill et al. |
| 6,164,135 | A | * | 12/2000 | Bicz ............................ 73/602 |

(Continued)

FOREIGN PATENT DOCUMENTS

| DE | 33 09 470 | 9/1984 |
| DE | 41 33 648 | 4/1999 |
| EP | 158 929 | 10/1985 |
| EP | 276 308 | 8/1988 |
| JP | 11-23543 | 1/1999 |

OTHER PUBLICATIONS

Krautkrämer, et al., "Ultrasonic Testing of Materials", Springer–Verlag Berlin Heidelberg New York 1977.
Krautkramer, "Emerging Technology—Guided Wave Ultrasonics"NDTnet, Jun. 1998, vol. 3, No. 6.

*Primary Examiner*—Hezron Williams
*Assistant Examiner*—Jacques M. Saint-Surin
(74) *Attorney, Agent, or Firm*—Merchant & Gould P.C.

(57) ABSTRACT

The invention relates to a method for non-destructive testing of materials, in which at least two differently guided waves (modes) are produced in the solid body, each at at least one specified angle, the measured reflection values are placed in relation to a reference echo in order to obtain a relative reflection value, and the relative reflection values of the individual modes are again placed in relation to one another, thereby enabling the size and type of the defects to be determined.

8 Claims, 1 Drawing Sheet

U.S. PATENT DOCUMENTS 6,173,613 B1 * 1/2001 Dunegan ..................... 73/587
6,341,525 B1 * 1/2002 Takada et al. ................ 73/627
6,393,917 B1 * 5/2002 Suh ............................. 73/628
6,429,650 B1 * 8/2002 Kwun et al. ................ 324/240
6,446,509 B1 * 9/2002 Takada et al. ................ 73/627
6,487,909 B2 * 12/2002 Harrold et al. ............... 73/593
6,502,463 B1 * 1/2003 Clark et al. ................... 73/643
6,581,014 B2 * 6/2003 Sills et al. .................... 702/39

* cited by examiner

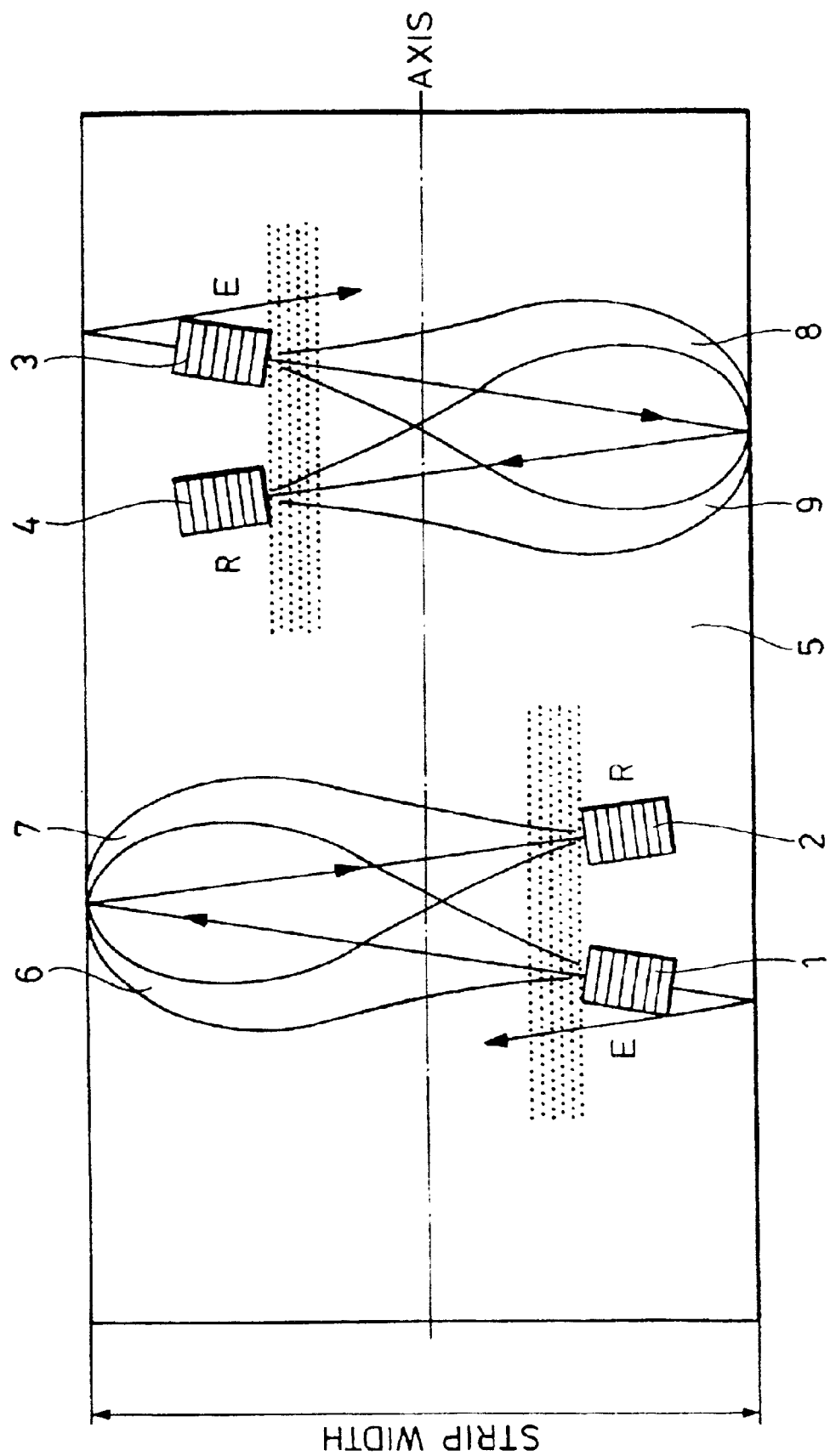

DEFECT TYPE CLASSIFYING METHOD

This application is a continuation of application Ser. No. 09/273,442, filed Mar. 22, 1999 now abandoned, which application(s) are incorporated herein by reference.

FIELD OF THE INVENTION

The invention relates to a method for non-destructive testing of materials.

BACKGROUND AND PRIOR ART

Such methods are used for testing rods, wires or plates.

One known method for non-destructive testing of materials is the eddy current method. In this method defects in materials are detected by the production of a magnetic field by induction. This method is also used in wire testing equipment.

It is known, for example, to use rotary testing equipment for testing wire. In testing wire with rotary testing equipment a free ultrasonic wave is produced in the material, the reflection echo of which at the defect in the material can be detected.

However, external defects, which make up the greater part of the defects in materials, cannot be detected by this method. Moreover, free waves cannot be produced in all materials. Hence, for example, material testing using a free wave is not possible in wires having a diameter less than 15 mm.

A known ultrasonic testing method makes use of a one-dimensional wave (mode) which is generated by means of a piezoelectric transducer. By a one- or two-dimensionally guided ultrasonic wave is meant an elastic wave of which the wavelengths in one or two dimensions respectively are comparable to or large compared with the linear dimensions of the body being measured. Parts of the boundary surface are constantly in interaction with the wave and thus cause guidance of the wave along this boundary surface. The body thereby acts as a wave guide.

The reflection echo of the wave can be detected and then provides information about the existence of a defect in the material. From the amplitude of the echo some evidence of the size of the defect can also be derived. This evidence is however based on experiment and estimated values and frequently does not agree with the actual facts. False estimates are often attributable to spurious echoes, for example the echo from the outer wall of the material or echoes from other sound reflectors.

From German published patent application 41 33 648 it is known to test rods with two-dimensionally guided bar waves. This enables sensitive investigation of defects and determination of their size to be performed.

By evaluation of the amplitude, the course and the damping of the wave reflection at the defect a cross-sectional area of the defect can be calculated by means of the equivalent defect method. While the measured reflection value includes implicit information about the size and type of the defect, it is not possible to gain information about the type of defect, i.e. the eccentricity of the defect, since there is no known way of forming a relationship between the measured values and the eccentricity of the defect. All attempts to classify types of defect have therefore failed.

In testing strip using one-dimensionally guided plate waves ("Lamb modes") the applicant has already attempted, by the use of a system with a guided wave which is beamed into the test piece using two angles of incidence, to derive the eccentricity of the defect in the material from the two echoes which are detected. However, these attempts have not yielded any success because of the concrete properties of the material.

OBJECT OF THE INVENTION

The object of the invention is to provide a method for non-destructive testing of materials which makes determination of the size of the defect and classification of the type of the defect possible.

A further object is to enable the type of defect to be quickly determined.

SUMMARY OF THE INVENTION

To this end, in accordance with the invention in a method for testing solid bodies using guided ultrasonic waves a first and a second guided ultrasonic wave are produced in a solid body by means of an ultrasonic transmitter, reflection waves of the first and second ultrasonic waves are detected by an ultrasonic receiver and structures or defects in the material of the solid body are determined by combination of the detected values of the first wave and the detected values of the second wave.

In an embodiment of the invention at least two differently guided waves (modes) are produced in the solid body, each at at least one specified angle, the measured reflection values are placed in relation to a reference echo in order to obtain a relative reflection value, and the relative reflection values of the individual modes are placed in relation to one another, thereby enabling the size and type of the defects to be determined.

Each measured value of each mode thus contains coupled information about the size of the defect and its type. By combination of the information in two guided waves the respective values for the size and type of the defect can be determined separately and independently of one another by elimination of the respective other value.

The guided wave is first of all beamed in so that a reflection value is obtained which contains the defect echo and a reference echo. This can for example be the back wall echo of a measured plate. The back wall echo can be distinguished from the defect echo since it has a longer transit time. By means of the back wall echo and the defect echo the relative defect echo of each mode can be determined.

As reference echo any sound reflector can be used, for example a point at which a wire deflection pulley presses on the wire. Preferably the largest detectable signal is used as reference echo.

The relative defect echo is measured for two different guided waves (modes). The measured values are entered into the implied functions of the type and area of the defect which hold for the type and mode of the wave.

From the combination of suitable functions of the selected modes, which can be determined by decoupling and scalarisation of the wave equations for the components of the particle displacement vector, the value for the type and size of the defect can be determined by computation for each kind of guided wave (Rayleigh waves, plate waves, bar waves, tube waves).

Since a time-consuming calculation is involved, and in the testing of materials, for example in the ultrasonic testing of cold-rolled steel strip, continuous investigation of defects in real time on the running strip is desired, in order to speed up the investigation of defects the reflection values can be calculated for a desired number of sizes and types of defect before the measuring procedure, so that during the measurement only a comparison of the measured reflection values with the calculated reflection values is necessary, so that the detected defects can quickly be evaluated as to type and size.

To increase the precision of the measuring and testing system the boundary conditions at the surface of the defect, i.e. the normal components of the stress tensor at the free surfaces of the material, can be taken into account. For if the boundary value problem is not taken into consideration there is some deviation of the measured reflection value and of the defect value determined therefrom from the actual size and type of the defect, since it is first of all assumed that there is complete reflection from the defect and the actual size of the defect—or the deviation of the defect reflection from the complete reflection due to the boundary value—is only estimated from experimental values.

To take account of the boundary conditions actually obtaining, which lead to a falsification of the reflection of the defect, the boundary conditions must enter directly into the defect calculation. For this purpose the tensor boundary conditions are first of all scalarised by suitable breakdown of the vector for the particle displacement into three linear independent partial vectors and by use of three suitable scalar potentials.

Since a complete decoupling for the boundary conditions is not possible, an approximation method known from quantum mechanics is used in order to obtain values satisfactory for practical purposes. It is surprisingly found that by means of the perturbation calculation a good defect classification is already obtained with a first order approximation.

BRIEF DESCRIPTION OF THE DRAWING

The invention will be described in more detail below, by way of example, with reference to an embodiment shown in the FIGURE, which shows two transmitter/receiver pairs disposed above a steel strip.

DETAILED DESCRIPTION OF A PREFERRED EMBODIMENT

An example of the use of the method in accordance with the invention for detecting defects in cold-rolled steel strip using two plate wave modes is described below, wherein the starting point is the propagation of an elastic plate wave in an elastic, undamped, homogeneous, non-piezoelectric solid body. Tube or bar waves can also be used.

With regard to construction, putting the invention into practice first requires an arrangement of the ultrasonic transmitter and receiver which permits propagation of the guided wave in the plate and in which transmitter and receiver cones overlap in the respective intensity maximum.

Such an arrangement is shown in the drawing, in which pairs 1, 2; 3, 4 of transmitters E and receivers R are disposed above a steel strip 5 of a cold rolling mill train at a specific angle such that the sound cones 6, 8 intersect the receiver cones 7, 9 in the intensity maximum. Receivers and transmitters are disposed at a transducer spacing from centre to centre of the transducers of 60 mm, a transducer width of 50 mm each and a wavelength of 4 mm at a distance of 0.4 mm from the steel strip, each at 3.5° to the vertical. The angle is selected so that the sound beam is almost free from divergence.

The value measured at each receiver is first brought into relation with the measured reference echo. On the basis of the following considerations, and after correction for damping and divergence due to distance, this relative value, in combination with the relative measured value of the other receiver, allows the type and size of defects to be determined: for steel strip it is preferred to use SH modes and Lamb modes.

Let a plate wave propagate in a homogeneous, isotropic, undamped, nonpiezoelectric, elastic plate of constant thickness d. Let the Cartesian coordinate system $(x_1, x_2, x_3$ with the normal unit vectors $e_1$, $e_2$, $e_3$ to describe this wave propagation be selected such that the sound propagation takes place in the $x_1$ direction, let the two plate surfaces lie parallel and symmetrical to the plane $x_2=0$ and let the plate itself be characterised by the dimensional relationship $-d/2 \leq x_2 \leq +d/2$.

If, to formulate the boundary value problem and in all further calculations, we make use of tensor calculus, and time is denoted by t, thickness by $\rho$, the stress tensor by T, the particle displacement vector by u and the force density vector by f, then by use of the $\Lambda$ operator we obtain for the plate wave the fundamental dynamic equation:

$$\nabla \cdot T = \rho \frac{\partial^2}{\partial t^2} u - f \quad (1)$$

and the material equation:

$$T = \mu[(\nabla u) + (\nabla u)^T] + \lambda (\nabla \cdot u) 1 \quad (2)$$

Let the source of the plate wave be located at $x_1 = -\infty$. Then finally:

$$f \equiv 0 \quad (3)$$

From (1), (2) and (3) the following equation of motion then follows at once for the particle displacement vector:

$$\mu \Delta u + (\mu + \lambda) \nabla (\nabla \cdot u) - \rho \frac{\partial^2}{\partial t^2} u = 0 \quad (4)$$

By introducing three suitable potentials $\nu$, P, $\Pi$ this equation of motion can be split up into three decoupled wave equations.

The boundary conditions for the propagation problem of the monochromatic elastic plate waves are given by the requirement of identical disappearance of the normal components of the stress tensor T at the two "free" surfaces. One thus obtains directly:

$$(T \cdot e_2)_{x_2 = -\frac{d}{2}} \equiv 0 \wedge (T \cdot e_2)_{x_2 = +\frac{d}{2}} \equiv 0 \quad (5)$$

From (5) there follows, in view of (2), the formulation of the boundary conditions for the particle displacement vector u as:

$$(\partial_2 u_1 + \partial_1 u_2)_{x_2 = -\frac{d}{2}} \equiv 0 \quad \wedge \quad (\partial_2 u_1 + \partial_1 u_2)_{x_2 = +\frac{d}{2}} \equiv 0 \quad \wedge \quad (6)$$

$$(\lambda \partial_1 u_1 + (2\mu + \lambda) \partial_2 u_2)_{x_2 = -\frac{d}{2}} \equiv 0 \wedge (\lambda \partial_1 u_1 + (2\mu + \lambda) \partial_2 u_2)_{x_2 = +\frac{d}{2}} \equiv 0 \wedge$$

$$(\partial_2 u_3)_{x_2 = -\frac{d}{2}} \equiv 0 \quad \wedge \quad (\partial_2 u_3)_{x_2 = +\frac{d}{2}} \equiv 0 \quad ;$$

The boundary conditions (6) can be scalarised in just the same way as the equation of motion (4), by introducing the three scalar potentials v, P, Π, but the decoupling is only partial: the potentials v and P remain coupled together, while the potential Π and the associated partial solution of the boundary value problem is completely decoupled.

As a solution of the boundary value problem in plates the plate waves are obtained: the eigensolutions of the coupled boundary value problem are called Lamb modes, the eigensolutions which are associated with the potential Π are called SH modes.

SH Modes.

The SH modes (SH=shear horizontal–shear waves polarised horizontal to the plate surface) are characterised in that the particle displacement vector is always parallel to the plate surface. The SH modes are not to be confused with the freely propagating shear waves, which are sometimes called SH waves. Only for the lowest SH mode (n=0) do the particle excursions agree, that is to say, only then does the SH wave correspond to the mode $SS_0$.

As eigenvalue equation ("dispersion equation") for the SH modes there is obtained, for the dimensionless lateral coordinates of the wave number vector of the transverse wave which produces the plate wave:

$$\gamma_T = \frac{n\pi}{2} \wedge n \in \tilde{O}_0 \tag{7}$$

Since as plate waves the SH modes belong to the class of one-dimensionally guided waves, the lateral coordinate of the wave number vector $k_T$ can—as can be seen from (7)—only assume discrete values. Here the eigenfunctions for the eigenvalues with an even-numbered index n represent the class of the symmetrical SH modes and the eigenfunctions for the eigenvalues with an odd-numbered index n represent the class of the antisymmetrical SH modes.

The particle displacement vector for the special case of the symmetrical SH mode $SS_0$ is given by:

$$u^{(ss0)} = A^{(ss0)} \cos [k(x_1 - c_T t)] e_3 \tag{8}$$

From this the real, time-dependent acoustic Poynting vector for the special case of the symmetrical SH modes $SS_0$ is obtained as:

$$P^{(ss0)} = \rho c_T^3 k^2 A^{(ss0)2} \sin^2[k(x_1 - c_T t)] e_1 \tag{9}$$

The calculation of the reflection coefficient of a mode for a defect position is now carried out by the methods of the perturbation theory: as a zeroth approximation it is first assumed that the respective mode is only perturbed by the defect insofar as the acoustic power flow density arriving at the defect position is reflected by the cross section of the defect completely, without divergence and without mode conversion. The first approximation is obtained by assuming that the guided waves can be represented as a superposition of the unperturbed incident wave and an interference wave, which is partly reflected and partly transmitted. The interference wave is calculated by meeting the additional boundary condition at the defect surface. Here mode conversion and divergence of the beam of sound waves inevitably occur.

If we take as the model defect a rectangle with the relative length of side, the relative height 0 and the relative eccentricity γ, then as a zeroth approximation the reflection factor for the special case of the symmetrical SH mode $SS_0$ is:

$$R^{(SS_0)} = \sqrt{\eta \zeta} \tag{10}$$

Since the formula (10) for the virtual reflection factor of the symmetrical SH mode $SS_0$ of the plane model defect rectangle only contains the parameters relative defect length . and relative defect height 0, but not the parameter relative defect eccentricity γ, although defect detection is possible with the symmetrical SH mode $SS_0$ alone, classification of the type of the defect is not possible.

For the symmetrical SH modes $SS_m$ with m>0 the corresponding formula is:

$$R^{(SS_m)} = \sqrt{\eta \zeta \left[ 1 + \frac{\sin(2m\pi\eta)\cos(2m\pi\varepsilon)}{2m\pi\eta} \right]} \tag{11}$$

For the antisymmetrical SH modes $AS_m$, the corresponding formula is:

$$R^{(AS_m)} = \sqrt{\eta \zeta \left[ 1 - \frac{\sin((2m+1)\pi\eta)\cos((2m+1)\pi\eta)}{(2m+1)\pi\eta} \right]} \tag{12}$$

Since the formulae (5) and (6) for the reflection factor in a zeroth approximation contain all three relevant factors γ, 0 and . of the plane model defect, with the modes $SS_m$ with m=0 and $AS_m$ both defect detection and defect type classification are possible.

Lamb Modes.

The Lamb modes as solution of the boundary value problem of guided elastic waves in an isotropic, homogeneous, non-piezoelectric, undamped plate are characterised in that there is an association between the lateral and the axial particle excursions, so that an elliptically polarised oscillation results.

As dispersion equation for the symmetrical Lamb modes there is obtained, according to $$F(\Theta,\gamma;q) := (\Theta-2)^2 \cos(+\gamma\sqrt{q\Theta-1})\sin(+\gamma\sqrt{\Theta-1}) + 4\sqrt{q\Theta-1}\sqrt{\Theta-1}\sin(+\gamma \sqrt{q\Theta-1})\cos(+\gamma\sqrt{\Theta-1}) = 0 \tag{13}$$

an implicit functional equation for 1=1((;q), which however cannot be explicitly represented analytically. If we investigate the functional equation (13) by means of the theory of functions, we find that there are infinitely enumerable function branches, which do not intersect anywhere and which could therefore be unambiguously numbered in increasing order. Analogously to the SH modes, we therefore do not consecutively number the dimensionless eigenvalues 1, but—beginning at zero—the associated eigensolutions. We shall denote these symmetrical Lamb modes by $S_m$.

The reflection factor for the symmetrical Lamb modes $S_m$ is obtained as a zeroth approximation as $$R^{(S_m)} = \sqrt{\zeta \frac{Z^{(S_m)}}{N^{(S_m)}}} \tag{14}$$

For the auxiliary values appearing in (14) the relationships:

$$Z^{(S_m)} = 4\gamma\eta\Theta^{(S_m)}(\gamma;q)(q\Theta^{(S_m)}(\gamma;q)-1)\sin^2\left(+\gamma\sqrt{q\Theta^{(S_m)}(\gamma;q)-1}\right) + \gamma\eta\Theta^{(S_m)}(\gamma;q)(\Theta^{(S_m)}(\gamma;q)-2)^2 \cdot \quad (15)$$
$$\sin^2\left(+\gamma\sqrt{\Theta^{(S_m)}(\gamma;q)-1}\right) + 2(q\Theta^{(S_m)}(\gamma;q)-1)(3\Theta^{(S_m)}(\gamma;q)-4)\sin^2\left(+\gamma\sqrt{q\Theta^{(S_m)}(\gamma;q)-1}\right) \cdot$$
$$\frac{\sin\left(+2\gamma\eta\sqrt{\Theta^{(S_m)}(\gamma;q)-1}\right)}{+\sqrt{\Theta^{(S_m)}(\gamma;q)-1}}\cos\left(+2\gamma\varepsilon\sqrt{\Theta^{(S_m)}(\gamma;q)-1}\right) + (\Theta^{(S_m)}(\gamma;q)-4q\Theta^{(S_m)}(\gamma;q)+4)$$
$$(\Theta^{(S_m)}(\gamma;q)-2)^2\sin^2\left(+\gamma\sqrt{\Theta^{(S_m)}(\gamma;q)-1}\right)\frac{\sin\left(+2\gamma\eta\sqrt{q\Theta^{(S_m)}(\gamma;q)-1}\right)}{+2\sqrt{q\Theta^{(S_m)}(\gamma;q)-1}}$$
$$\cos\left(+2\gamma\varepsilon\sqrt{q\Theta^{(S_m)}(\gamma;q)-1}\right) - 2(\Theta^{(S_m)}(\gamma;q)-2)(\Theta^{(S_m)}(\gamma;q)-2q\Theta^{(S_m)}(\gamma;q)+4)$$
$$\sqrt{q\Theta^{(S_m)}(\gamma;q)-1}\sqrt{\Theta^{(S_m)}(\gamma;q)-1}\cdot\sin\left(+\gamma\sqrt{q\Theta^{(S_m)}(\gamma;q)-1}\right)\sin\left(+\gamma\sqrt{\Theta^{(S_m)}(\gamma;q)-1}\right)\cdot$$
$$\left\{\frac{\sin\left[\gamma\eta\left(+\sqrt{\Theta^{(S_m)}(\gamma;q)-1}-\sqrt{q\Theta^{(S_m)}(\gamma;q)-1}\right)\right]}{\left(+\sqrt{\Theta^{(S_m)}(\gamma;q)-1}-\sqrt{q\Theta^{(S_m)}(\gamma;q)-1}\right)}\cos\left[\gamma\varepsilon\left(+\sqrt{\Theta^{(S_m)}(\gamma;q)-1}-\right.\right.\right.$$
$$\left.\left.\sqrt{q\Theta^{(S_m)}(\gamma;q)-1}\right)\right] + \frac{\sin\left[\gamma\eta\left(+\sqrt{\Theta^{(S_m)}(\gamma;q)-1}+\sqrt{q\Theta^{(S_m)}(\gamma;q)-1}\right)\right]}{\left(+\sqrt{\Theta^{(S_m)}(\gamma;q)-1}+\sqrt{q\Theta^{(S_m)}(\gamma;q)-1}\right)}$$
$$\left.\cos\left[\gamma\varepsilon\left(+\sqrt{\Theta^{(S_m)}(\gamma;q)-1}+\sqrt{q\Theta^{(S_m)}(\gamma;q)-1}\right)\right]\right\} + 2(\Theta^{(S_m)}(\gamma;q)-2)(q\Theta^{(S_m)}(\gamma;q)-1)$$
$$(4-\Theta^{(S_m)}(\gamma;q))\sin\left(+\gamma\sqrt{q\Theta^{(S_m)}(\gamma;q)-1}\right)\cdot\sin\left(+\gamma\sqrt{\Theta^{(S_m)}(\gamma;q)-1}\right)\cdot$$
$$\left\{\frac{\sin\left[\gamma\eta\left(+\sqrt{\Theta^{(S_m)}(\gamma;q)-1}-\sqrt{q\Theta^{(S_m)}(\gamma;q)-1}\right)\right]}{\left(+\sqrt{\Theta^{(S_m)}(\gamma;q)-1}-\sqrt{q\Theta^{(S_m)}(\gamma;q)-1}\right)}\cos\left[\gamma\varepsilon\left(+\sqrt{\Theta^{(S_m)}(\gamma;q)-1}-\right.\right.\right.$$
$$\left.\left.\sqrt{q\Theta^{(S_m)}(\gamma;q)-1}\right)\right] - \frac{\sin\left[\gamma\eta\left(+\sqrt{\Theta^{(S_m)}(\gamma;q)-1}+\sqrt{q\Theta^{(S_m)}(\gamma;q)-1}\right)\right]}{\left(+\sqrt{\Theta^{(S_m)}(\gamma;q)-1}+\sqrt{q\Theta^{(S_m)}(\gamma;q)-1}\right)}$$
$$\left.\cos\left[\gamma\varepsilon\left(+\sqrt{\Theta^{(S_m)}(\gamma;q)-1}+\sqrt{q\Theta^{(S_m)}(\gamma;q)-1}\right)\right]\right\}$$

and $$N^{(S_m)} = 4\gamma\Theta^{(S_m)}(\gamma;q)(q\Theta^{(S_m)}(\gamma;q)-1)\sin^2\left(+\gamma\sqrt{q\Theta^{(S_m)}(\gamma;q)-1}\right) + \gamma\Theta^{(S_m)}(\gamma;q)(\Theta^{(S_m)}(\gamma;q)-2)^2 \cdot \quad (16)$$
$$\sin^2\left(+\gamma\sqrt{\Theta^{(S_m)}(\gamma;q)-1}\right) + 2(q\Theta^{(S_m)}(\gamma;q)-1)(3\Theta^{(S_m)}(\gamma;q)-4)\sin^2\left(+\gamma\sqrt{q\Theta^{(S_m)}(\gamma;q)-1}\right) \cdot$$
$$\frac{\sin\left(+2\gamma\sqrt{\Theta^{(S_m)}(\gamma;q)-1}\right)}{\sqrt{\Theta^{(S_m)}(\gamma;q)-1}} + (\Theta^{(S_m)}(\gamma;q)-4q\Theta^{(S_m)}(\gamma;q)+4)$$
$$(\Theta^{(S_m)}(\gamma;q)-2)^2\cdot\sin^2\left(+\gamma\sqrt{\Theta^{(S_m)}(\gamma;q)-1}\right)\frac{\sin\left(+2\gamma\sqrt{q\Theta^{(S_m)}(\gamma;q)-1}\right)}{+2\sqrt{q\Theta^{(S_m)}(\gamma;q)-1}} -$$
$$2(\Theta^{(S_m)}(\gamma;q)-2)(\Theta^{(S_m)}(\gamma;q)-2q\Theta^{(S_m)}(\gamma;q)+4)\sqrt{q\Theta^{(S_m)}(\gamma;q)-1}\sqrt{\Theta^{(S_m)}(\gamma;q)-1}$$
$$\sin\left(+\gamma\sqrt{q\Theta^{(S_m)}(\gamma;q)-1}\right)\cdot\sin\left(+\gamma\sqrt{\Theta^{(S_m)}(\gamma;q)-1}\right)\cdot$$
$$\left\{\frac{\sin\left[\gamma\left(\sqrt{\Theta^{(S_m)}(\gamma;q)-1}-\sqrt{q\Theta^{(S_m)}(\gamma;q)-1}\right)\right]}{\left(\sqrt{\Theta^{(S_m)}(\gamma;q)-1}-\sqrt{q\Theta^{(S_m)}(\gamma;q)-1}\right)} + \right.$$
$$\left.\frac{\sin\left[\gamma\left(\sqrt{\Theta^{(S_m)}(\gamma;q)-1}+\sqrt{q\Theta^{(S_m)}(\gamma;q)-1}\right)\right]}{\left(\sqrt{\Theta^{(S_m)}(\gamma;q)-1}+\sqrt{q\Theta^{(S_m)}(\gamma;q)-1}\right)}\right\} + (\Theta^{(S_m)}(\gamma;q)-2)(q\Theta^{(S_m)}(\gamma;q)-1)$$
$$2(4-\Theta^{(S_m)}(\gamma;q))\sin\left(+\gamma\sqrt{q\Theta^{(S_m)}(\gamma;q)-1}\right)\cdot\sin\left(+\gamma\sqrt{\Theta^{(S_m)}(\gamma;q)-1}\right)\cdot$$
$$\left\{\frac{\sin\left[\gamma\left(\sqrt{\Theta^{(S_m)}(\gamma;q)-1}-\sqrt{q\Theta^{(S_m)}(\gamma;q)-1}\right)\right]}{\left(\sqrt{\Theta^{(S_m)}(\gamma;q)-1}-\sqrt{q\Theta^{(S_m)}(\gamma;q)-1}\right)} - \right.$$
$$\left.\frac{\sin\left[\gamma\left(\sqrt{\Theta^{(S_m)}(\gamma;q)-1}+\sqrt{q\Theta^{(S_m)}(\gamma;q)-1}\right)\right]}{\left(\sqrt{\Theta^{(S_m)}(\gamma;q)-1}+\sqrt{q\Theta^{(S_m)}(\gamma;q)-1}\right)}\right\}$$

apply.

Since the formulae (14) to (16) for the reflection factor of the symmetrical Lamb modes $S_m$ as a zeroth approximation contain the parameter, explicitly and the two parameters 0 and $\gamma$ implicitly, with these modes both defect detection and also defect type classification are possible.

For the antisymmetrical Lamb modes $A_m$ the corresponding formulae can be derived in strictly analogous manner to the formulae (14) to (16). It is then also the case for the antisymmetrical Lamb modes that with them both a defect detection and a defect type classification is possible. It is preferred to use the mode $A_0$, since here the conversion into practice gives the cleanest measuring signal, since they do not have "foreign mode signals" of symmetrical modes superimposed on them.

What is claimed is:

1. A method for testing solid bodies using guided ultrasonic waves, comprising:
    producing a first guided ultrasonic wave in a solid body by means of an ultrasonic transmitter, the first guided ultrasonic wave having a first mode;
    detecting reflection waves of the first guided ultrasonic wave by an ultrasonic receiver;
    producing a second guided ultrasonic wave in the solid body by means of the ultrasonic transmitter, the second guided ultrasonic wave having a second mode;
    detecting reflection waves of the second guided ultrasonic wave by the ultrasonic receiver;
    determining structures of defects in material of solid body by combination of detected values of the reflection waves of the first guided ultrasonic wave and the second guided ultrasonic wave; and
    accelerating and evaluation of a defect by converting all reflection values of the reflection values of the reflection waves in an expected region into defect values before measurement and wherein measurement comprises a comparison of the measured reflection values with previously calculated values.

2. A method as claimed in claim 1, wherein the first and second waves are plate waves.

3. A method as claimed in claim 2, further comprising performing a determination of a type and a determination of a size of material defects.

4. A method for testing solid bodies using guided ultrasonic waves, comprising:
    producing a first guided ultrasonic plate wave in a solid body by means of an ultrasonic transmitter, the first guided ultrasonic plate wave having a first mode;
    detecting reflection waves of the first guided ultrasonic plate wave by an ultrasonic receiver;
    producing a second guided ultrasonic plate wave in the solid body by means of the ultrasonic transmitter, the second guided ultrasonic plate wave having a second mode;
    detecting reflection waves of the second guided ultrasonic wave by the ultrasonic receiver;
    determining structures or defects in material of the solid body by combination of detected values of the reflection waves of the first guided ultrasonic plate wave and the second guided ultrasonic plate wave; and
    determining a type and a size of the defects by means of the following relationships:

$$Z^{(S_m)} = 4\gamma\eta\Theta^{(S_m)}(\gamma; q)(q\Theta^{(S_m)}(\gamma; q) - 1)\sin^2\left(+\gamma\sqrt{q\Theta^{(S_m)}(\gamma; q) - 1}\right) + \sin^2\left(+\gamma\sqrt{q\Theta^{(S_m)}(\gamma; q) - 1}\right) +$$

$$2(q\Theta^{(S_m)}(\gamma; q) - 1)(3\Theta^{(S_m)}(\gamma; q) - 4)\sin^2\left(+\gamma\sqrt{q\Theta^{(S_m)}(\gamma; q) - 1}\right) \cdot \frac{\sin\left(+2\gamma\eta\sqrt{\Theta^{(S_m)}(\gamma; q) - 1}\right)}{+\sqrt{\Theta^{(S_m)}(\gamma; q) - 1}}$$

$$\cos\left(+2\gamma\varepsilon\sqrt{\Theta^{(S_m)}(\gamma; q) - 1}\right) + (\Theta^{(S_m)}(\gamma; q) - 4q\Theta^{(S_m)}(\gamma; q) + 4)(\Theta^{(S_m)}(\gamma; q) - 2)^2$$

$$\sin^2\left(+\gamma\sqrt{\Theta^{(S_m)}(\gamma; q) - 1}\right)\frac{\sin\left(+2\gamma\eta\sqrt{q\Theta^{(S_m)}(\gamma; q) - 1}\right)}{+2\sqrt{q\Theta^{(S_m)}(\gamma; q) - 1}}\cos\left(+2\gamma\varepsilon\sqrt{q\Theta^{(S_m)}(\gamma; q) - 1}\right) -$$

$$2(q\Theta^{(S_m)}(\gamma; q) - 2)(q\Theta^{(S_m)}(\gamma; q) - 2q\Theta^{(S_m)}(\gamma; q) + 4)\sqrt{q\Theta^{(S_m)}(\gamma; q) - 1}\sqrt{\Theta^{(S_m)}(\gamma; q) - 1} \cdot$$

$$\sin\left(+\gamma\sqrt{q\Theta^{(S_m)}(\gamma; q) - 1}\right)\sin\left(\gamma\sqrt{\Theta^{(S_m)}(\gamma; q) - 1}\right) \cdot$$

$$\left\{\frac{\sin\left[\gamma\eta(+\sqrt{\Theta^{(S_m)}(\gamma; q) - 1} - \sqrt{q\Theta^{(S_m)}(\gamma; q) - 1})\right]}{\left(+\sqrt{\Theta^{(S_m)}(\gamma; q) - 1} - \sqrt{q\Theta^{(S_m)}(\gamma; q) - 1}\right)}\cos\left[\gamma\varepsilon\left(+\sqrt{\Theta^{(S_m)}(\gamma; q) - 1} - \right.\right.\right.$$

$$\left.\left.\sqrt{q\Theta^{(S_m)}(\gamma; q) - 1}\right)\right] + \frac{\sin\left[\gamma\eta(+\sqrt{\Theta^{(S_m)}(\gamma; q) - 1} + \sqrt{q\Theta^{(S_m)}(\gamma; q) - 1})\right]}{\left(+\sqrt{\Theta^{(S_m)}(\gamma; q) - 1} + \sqrt{q\Theta^{(S_m)}(\gamma; q) - 1}\right)}$$

$$\left.\cos\left[\gamma\varepsilon\left(+\sqrt{\Theta^{(S_m)}(\gamma; q) - 1} + \sqrt{q\Theta^{(S_m)}(\gamma; q) - 1}\right)\right]\right\} + 2(\Theta^{(S_m)}(\gamma; q) - 2)(q\Theta^{(S_m)}(\gamma; q) - 1)$$

$$(4 - \Theta^{(S_m)}(\gamma; q))\sin\left(+\gamma\sqrt{q\Theta^{(S_m)}(\gamma; q) - 1}\right) \cdot \sin\left(+\gamma\sqrt{\Theta^{(S_m)}(\gamma; q) - 1}\right) \cdot$$

$$\left\{\frac{\sin\left[\gamma\eta(+\sqrt{\Theta^{(S_m)}(\gamma; q) - 1} - \sqrt{q\Theta^{(S_m)}(\gamma; q) - 1})\right]}{\left(+\sqrt{\Theta^{(S_m)}(\gamma; q) - 1} - \sqrt{q\Theta^{(S_m)}(\gamma; q) - 1}\right)}\cos\left[\gamma\varepsilon\left(+\sqrt{\Theta^{(S_m)}(\gamma; q) - 1} - \right.\right.\right.$$

$$\left.\left.\sqrt{q\Theta^{(S_m)}(\gamma; q) - 1}\right)\right] - \frac{\sin\left[\gamma\eta(+\sqrt{\Theta^{(S_m)}(\gamma; q) - 1} + \sqrt{q\Theta^{(S_m)}(\gamma; q) - 1})\right]}{\left(+\sqrt{\Theta^{(S_m)}(\gamma; q) - 1} + \sqrt{q\Theta^{(S_m)}(\gamma; q) - 1}\right)}$$

$$\left.\cos\left[\gamma\varepsilon\left(+\sqrt{\Theta^{(S_m)}(\gamma; q) - 1} + \sqrt{q\Theta^{(S_m)}(\gamma; q) - 1}\right)\right]\right\}$$

and

-continued $$N^{(S_m)} = 4\gamma\Theta^{(S_m)}(\gamma; q)(q\Theta^{(S_m)}(\gamma; q) - 1)\sin^2\left(+\gamma\sqrt{q\Theta^{(S_m)}(\gamma; q) - 1}\right) + \gamma\Theta^{(S_m)}(\gamma; q)(\Theta^{(S_m)}(\gamma; q) - 2)^2 \cdot$$
$$\sin^2\left(+\gamma\sqrt{\Theta^{(S_m)}(\gamma; q) - 1}\right) + 2(q\Theta^{(S_m)}(\gamma; q) - 1)(3\Theta^{(S_m)}(\gamma; q) - 4)\sin^2\left(+\gamma\sqrt{q\Theta^{(S_m)}(\gamma; q) - 1}\right) \cdot$$
$$\frac{\sin\left(+2\gamma\sqrt{\Theta^{(S_m)}(\gamma; q) - 1}\right)}{\sqrt{\Theta^{(S_m)}(\gamma; q) - 1}} + (\Theta^{(S_m)}(\gamma; q) - 4q\Theta^{(S_m)}(\gamma; q) + 4)(\Theta^{(S_m)}(\gamma; q) - 2)^2 \cdot$$
$$\sin^2\left(+\gamma\sqrt{\Theta^{(S_m)}(\gamma; q) - 1}\right)\frac{\sin\left(+2\gamma\sqrt{q\Theta^{(S_m)}(\gamma; q) - 1}\right)}{+2\sqrt{q\Theta^{(S_m)}(\gamma; q) - 1}} -$$
$$2(\Theta^{(S_m)}(\gamma; q) - 2)(\Theta^{(S_m)}(\gamma; q) - 2q\Theta^{(S_m)}(\gamma; q) + 4)\sqrt{q\Theta^{(S_m)}(\gamma; q) - 1}\sqrt{\Theta^{(S_m)}(\gamma; q) - 1}$$
$$\sin\left(+\gamma\sqrt{q\Theta^{(S_m)}(\gamma; q) - 1}\right) \cdot \sin\left(+\gamma\sqrt{\Theta^{(S_m)}(\gamma; q) - 1}\right) \cdot$$
$$\left\{\frac{\sin\left[\gamma\left(\sqrt{\Theta^{(S_m)}(\gamma; q) - 1} - \sqrt{q\Theta^{(S_m)}(\gamma; q) - 1}\right)\right]}{\left(\sqrt{\Theta^{(S_m)}(\gamma; q) - 1} - \sqrt{q\Theta^{(S_m)}(\gamma; q) - 1}\right)} + \frac{\sin\left[\gamma\left(\sqrt{\Theta^{(S_m)}(\gamma; q) - 1} + \sqrt{q\Theta^{(S_m)}(\gamma; q) - 1}\right)\right]}{\left(\sqrt{\Theta^{(S_m)}(\gamma; q) - 1} + \sqrt{q\Theta^{(S_m)}(\gamma; q) - 1}\right)}\right\} +$$
$$2(\Theta^{(S_m)}(\gamma; q) - 2)(q\Theta^{(S_m)}(\gamma; q) - 1)(4 - \Theta^{(S_m)}(\gamma; q))\sin\left(+\gamma\sqrt{q\Theta^{(S_m)}(\gamma; q) - 1}\right) \cdot$$
$$\sin\left(+\gamma\sqrt{\Theta^{(S_m)}(\gamma; q) - 1}\right) \cdot$$
$$\left\{\frac{\sin\left[\gamma\left(\sqrt{\Theta^{(S_m)}(\gamma; q) - 1} - \sqrt{q\Theta^{(S_m)}(\gamma; q) - 1}\right)\right]}{\left(\sqrt{\Theta^{(S_m)}(\gamma; q) - 1} - \sqrt{q\Theta^{(S_m)}(\gamma; q) - 1}\right)} - \frac{\sin\left[\gamma\left(\sqrt{\Theta^{(S_m)}(\gamma; q) - 1} + \sqrt{q\Theta^{(S_m)}(\gamma; q) - 1}\right)\right]}{\left(\sqrt{\Theta^{(S_m)}(\gamma; q) - 1} + \sqrt{q\Theta^{(S_m)}(\gamma; q) - 1}\right)}\right\}$$

5. A method for testing solid bodies using guided ultrasonic waves, comprising:
- producing a first guided ultrasonic plate wave in a solid body by means of an ultrasonic transmitter, the first guided ultrasonic plate wave having a first mode;
- detecting reflection waves of the first guided ultrasonic plate wave by an ultrasonic receiver;
- producing a second guided ultrasonic plate wave in the solid body by means of the ultrasonic transmitter, the second guided ultrasonic plate wave having a second mode;
- detecting reflection waves of the second guided ultrasonic wave by the ultrasonic receiver;
- determining structures or defects in material of the solid body by combination of detected values of the reflection waves of the firs guided ultrasonic plate wave and the second guided ultrasonic plate wave; and
- bringing a measure value of a defect into relationship with a reference echo in the solid body to form a relative measure value, and using the relative measured value to determine a type and a size of the defect.

6. A method as claimed in claim 1, wherein the waves comprise on of tube or bar waves.

7. A method as claimed in claim 1, wherein the first wave is a Lamb wave and the second wave is an SH wave.

8. A method as claimed in claim 7, wherein the Lamb wave is a S-0 wave and the SH wave is an S-1 wave.

* * * * *